US012776474B2

(12) United States Patent
de Vos et al.

(10) Patent No.: US 12,776,474 B2
(45) Date of Patent: Oct. 27, 2026

(54) SCANNING PATTERNS FOR SCIENTIFIC INSTRUMENTS

(71) Applicant: FEI Company, Hillsboro, OR (US)

(72) Inventors: Gert-Jan de Vos, Eindhoven (NL); Joris Achten, Eindhoven (NL); Addo Hammen, Eindhoven (NL); Kees Kooijman, Eindhoven (NL); Sander Stoks, Eindhoven (NL)

(73) Assignee: FEI COMPANY, Hillsboro, OR (US)

(*) Notice: Subject to any disclaimer, the term of this patent is extended or adjusted under 35 U.S.C. 154(b) by 322 days.

(21) Appl. No.: 18/525,230

(22) Filed: Nov. 30, 2023

(65) Prior Publication Data

US 2025/0183002 A1 Jun. 5, 2025

(51) Int. Cl.
*H01J 37/26* (2006.01)

(52) U.S. Cl.
CPC .................................. *H01J 37/265* (2013.01)

(58) Field of Classification Search
CPC ........... H01J 37/265; H01J 37/28; H01J 37/09
USPC .......................................................... 250/310
See application file for complete search history.

(56) References Cited

U.S. PATENT DOCUMENTS 11,276,545 B1 * 3/2022 Basson .................... H01J 37/28
2016/0029472 A1 * 1/2016 Jevtic ................ H01J 37/32467
315/39
2024/0402102 A1 * 12/2024 Connors ................. G06T 7/246

FOREIGN PATENT DOCUMENTS

JP 2016110767 A 6/2016

OTHER PUBLICATIONS

EP24216622.1, Extended European Search Report, May 7, 2025, 9 pages.

* cited by examiner

*Primary Examiner* — Kiet T Nguyen
(74) *Attorney, Agent, or Firm* — Michael Best & Friedrich LLP

(57) ABSTRACT

Systems and methods for adjusting scanning patterns in scientific instruments based on electromagnetic interference. One example charged particle instrument includes a chamber supporting a sample, a column coupled to the chamber, a pump configured to establish a vacuum within the chamber, a sensing device configured to detect a measure of a frequency of electromagnetic interference generated via the pump, and a controller including an electronic processor and a memory. The column includes a charged particle source configured to generate a charged particle beam traveling through the column and into the chamber. The charged particle beam is generated according to a scanning pattern. The controller configured to receive, from the sensing device, a signal indicative of the frequency of the electromagnetic interference and adjust the scanning pattern based on the frequency of the electromagnetic interference.

18 Claims, 5 Drawing Sheets

SCANNING PATTERNS FOR SCIENTIFIC INSTRUMENTS

FIELD

The present disclosure generally relates to systems and methods for adjusting scanning patterns in scientific instruments based on electromagnetic interference, such as electromagnetic interference occurring within charged particle systems.

SUMMARY

Scanning scientific instruments, such as charged particle systems, include components that generate electromagnetic interference, such as molecular pumps. Other sensitive components involved in measuring samples, such as a column and detection electronics, may be situated close to the electromagnetic interference. For example, the electromagnetic interference may displace a scanning pattern while scanning a sample. Typically, shielding may be provided to block the electromagnetic interference. Alternatively, the sensitive components may be situated away from the electromagnetic interference. However, as instruments reduce in size, it is increasingly difficult to reduce the impact of electromagnetic interference.

Embodiments described herein implement an antenna near electromagnetic interference-generating components of a scientific instrument. The antenna is tuned to the approximate frequency of the electromagnetic interference. The measured frequency of the electromagnetic interference is provided to a controller configured to adjust, for example, a scanning pattern of the scientific instrument based on the interference. For example, scanning may be avoided during peaks of the electromagnetic interference.

In one aspect, a charged particle instrument includes a chamber supporting a sample, a column coupled to the chamber, and a pump configured to establish a vacuum within the chamber. The column includes a charged particle source configured to generate a charged particle beam traveling through the column and into the chamber. The charged particle beam is generated according to a scanning pattern. The charged particle instrument also includes a sensing device configured to detect a measure of a frequency of electromagnetic interference generated via the pump and a controller including an electronic processor and a memory. The controller is configured to receive, from the sensing device, a signal indicative of the frequency of the electromagnetic interference and adjust the scanning pattern based on the frequency of the electromagnetic interference.

In another aspect, a charged particle instrument includes a chamber supporting a sample and a column coupled to the chamber. The column includes a charged particle source configured to generate a charged particle beam traveling through the column and into the chamber. The charged particle beam is generated according to a scanning pattern. The charged particle instrument also includes an antenna configured to detect a frequency of electromagnetic interference generated by the charged particle instrument and a controller including an electronic processor and a memory. The controller is configured to receive, from the antenna, a signal indicative of the frequency of the electromagnetic interference and align a start of each scan line forming the scanning pattern with zero crossings of the electromagnetic interference.

In another aspect, a method for adjusting a scanning pattern in a charged particle instrument includes receiving, from an antenna and with an electronic processor, a signal indicative of the frequency of electromagnetic interference. The electromagnetic interference is generated by a pump configured to establish a vacuum within a chamber supporting a sample. The method includes adjusting, with the electronic processor, a scanning pattern of a charged particle beam based on the frequency of the electromagnetic interference. The charged particle beam is generated by a charged particle source of a column. The column is coupled to the chamber, and the charged particle beam travels through the column to the chamber.

There is no specific requirement that a system, method, or technique relating to scanning scientific instruments include all of the details characterized herein to obtain some benefit according to the present disclosure. Thus, the specific examples characterized herein are meant to be example applications of the techniques described and alternatives are possible.

BRIEF DESCRIPTION OF THE DRAWINGS

Features and advantages of the present technology will become more apparent from the following detailed description of example embodiments thereof taken in conjunction with the accompanying drawings in which.

Figure 1:
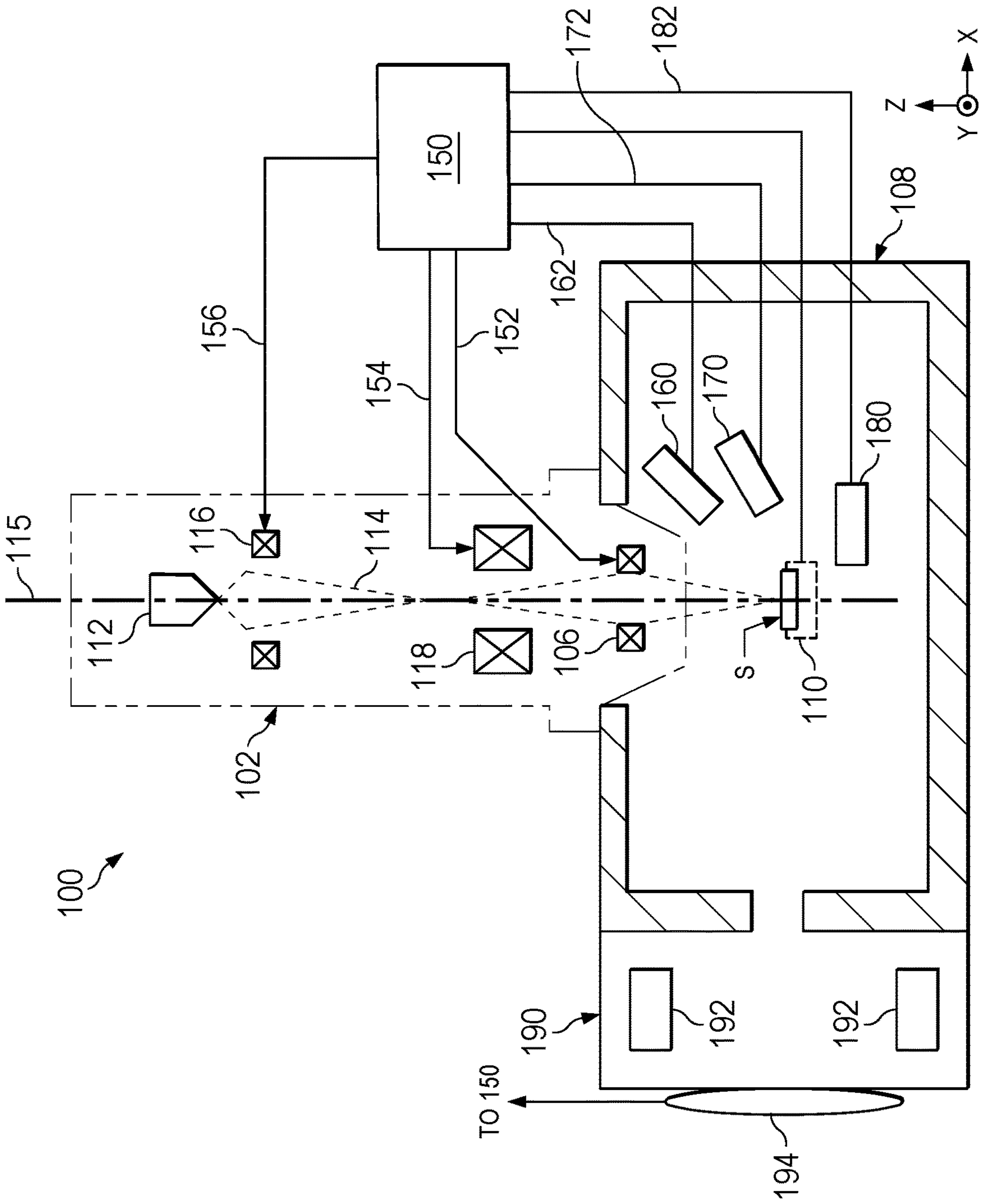
FIG. 1 is a block diagram illustrating an example scientific instrument in accordance with some embodiments.

While the present technology is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Unless otherwise defined, all technical and scientific terms used herein have the same meaning as commonly understood by one of ordinary skill in the art. In case of conflict, the present document, including definitions, will control. Example methods and systems are described below, although methods and systems similar or equivalent to those described herein can be used in practice or testing of the present disclosure. The systems, methods, and examples disclosed herein are illustrative only and not intended to be limiting.

The terms “comprise(s),” “include(s),” “having,” “has,” “can,” “contain(s),” and variants thereof, as used herein, are intended to be open-ended transitional phrases, terms, or words that do not preclude the possibility of additional acts or structures. The singular forms "a," "an" and "the" include plural references unless the context clearly dictates otherwise.

The modifier "about" used in connection with a quantity is inclusive of the stated value and has the meaning dictated by the context (for example, it includes at least the degree of error associated with the measurement of the particular quantity). The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1. Other meanings of "about" may be apparent from the context, such as rounding off, so, for example "about 1" may also mean from 0.5 to 1.4.

As used herein, the term "or" is intended to mean an inclusive "or" rather than an exclusive "or." That is, unless specified otherwise, or clear from context, "X employs A or B" is intended to mean any of the natural inclusive permutations. That is, if X employs A, X employs B, or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

The present disclosure is now described with reference to the drawings, wherein like reference numerals are used to refer to like elements throughout. In the following description, for purposes of explanation, numbers of specific details are set forth in order to provide an improved understanding of the present disclosure. It may be evident, however, that the systems and methods of the present disclosure may be practiced without one or more of these specific details. In other instances, well-known structures and devices are shown in block diagram form in order to facilitate describing the systems and methods of the present disclosure.

FIG. 1 is a block diagram illustrating a scientific instrument 100 in accordance with some embodiments. The scientific instrument 100 includes a scanning transmission electron microscope (STEM) column 102 coupled to a vacuum chamber 108. The vacuum chamber 108 houses a movable sample holder 110 and can be evacuated using one or more vacuum pumps 190. In an example embodiment, the sample holder 110 is independently movable parallel to the XY-coordinate plane and parallel to the Z-coordinate axis, with the corresponding coordinate system being indicated by the XYZ-coordinate triad shown in FIG. 1. A sample S to be interrogated using the scientific instrument 100 is mounted in the sample holder 110 as indicated in FIG. 1.

In the example shown, the STEM column 102 comprises an electron source 112 and two or more electron-beam lenses, only two of which (an objective lens 106 and a condenser lens 116 (collectively referred to as electron-beam lenses)), are schematically shown in FIG. 1 for illustration purposes. In some examples, a different (from two) number of such lenses may be used in the STEM column 102. In some embodiments, the objective lens 106 can be an ultra-high-resolution (UHR) lens.

In operation, the electron source 112 generates an electron beam 114 propagating generally along a longitudinal axis 115 of the STEM column 102. Electron-beam lenses 106 and 116 are operated to generate electric and magnetic fields that affect electron trajectories in the electron beam 114. Control signals 152, 156 generated by an electronic controller 150 are used to change the strengths and/or spatial configurations of the fields and impart desired properties on the electron beam 114. In general, the electron-beam lenses 106 and 116, control signals 152 and 156, and other pertinent components of the scientific instrument 100 can be used to perform various operations and support various functions, such as beam focusing, aberration mitigation, aperture cropping, filtering, and the like. In some embodiments, the STEM column 102 further comprises a deflection unit 118 that can steer the electron beam 114 in response to a control signal 154 applied thereto by the electronic controller 150. Such beam steering can be used to move a focused portion of the electron beam 114 along a desired path across the sample S, such as, for example, to perform a raster or vector scan thereof. The path of the electron beam 114 may henceforth be referred to as a scanning pattern.

The scientific instrument 100 also includes detectors 160, 170, 180 located in the vacuum chamber 108 in relatively close proximity to the sample S. In operation, the detectors 160, 170, and 180 generate streams of measurements 162, 172, and 182 that are received by the electronic controller 150. Specific types of the detectors 160, 170, 180 depend on the embodiment of the scientific instrument 100 and can typically be chosen from a variety of detector types suitable for detecting different types of emission and/or radiation from the sample S produced thereby in response to the electron beam 114. Example types of the emission/radiation that can be produced in this manner include, but are not limited to, X-rays, infrared light, visible light, ultraviolet light, back-scattered electrons, secondary electrons, auger electrons, elastically scattered electrons, non-scattered (e.g., zero energy loss) electrons, and non-elastically scattered electrons. In various embodiments, a different (from three) number of such detectors can be used in the scientific instrument 10. In some embodiments, the detectors 160, 170, 180 are selected from the group consisting of a high-angle annular dark field detector, a medium-angle annular dark field detector, an annular bright field detector, a segmented annular detector, a differential phase contrast detector, and a two-dimensional (e.g., pixelated) diffraction-pattern detector. Other detectors capable of detecting various ones of the above-mentioned types of emission/radiation can also be used in various additional embodiments.

Additionally, while the scientific instrument 100 includes the electron source 112 that generates the electron beam 114, embodiments described herein may be implemented with charged particle instruments that includes other types of charged particle sources and charged particle beams. For example, an ion source may generate an ion beam for scanning the sample S.

The illustrated example pump 190 is a turbo molecular pump that includes a turbine-like rotor that rotates at high speed as driven by an electric motor. This electric motor contains static and rotating magnets that generate an electromagnetic field that varies over time with the same frequency as the rotating frequency of the motor, and which electromagnetic field effects the path of the electron beam 114 and/or the detectors 160, 170, 180. Furthermore, in some implementations of a turbo molecular pump, magnetic bearings are employed instead of (or in addition to) other types of bearings that may cause further electromagnetic interference.

In some implementations, another type of pump may replace the illustrated pump 190. For example, the pump 190 may be a turbo pump, a rotary mechanical pump, an oil diffusion pump, or the like.

Figure 2:
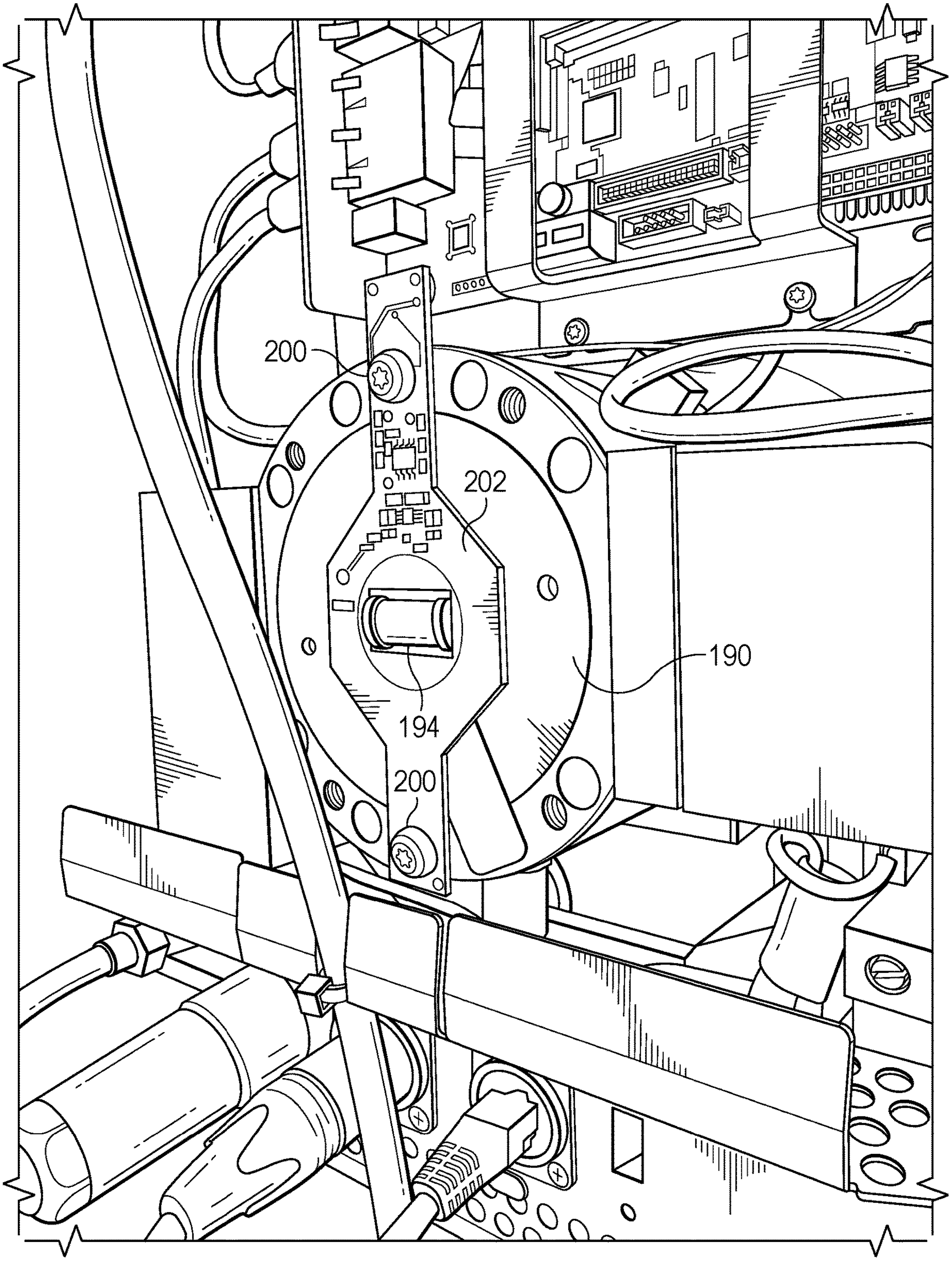
FIG. 2 is an illustration of an example antenna coupled to the scientific instrument of FIG. 1 in accordance with some embodiments.

An antenna 194 (e.g., a sensing device) is coupled to an exterior surface of the pump 190. In some instances, as shown in FIG. 2, the antenna 194 is mounted, bolted, or otherwise secured to the exterior surface of the pump 190 via fasteners 200. In some instances, the antenna 194 is mounted to a printed circuit board (PCB) 202, and the PCB 202 is mounted to the exterior surface of the pump 190. Also, in some instances, the antenna 194 may be mounted near the pump 190 without being mounted to the pump 190. For example, the antenna 194 may be mounted on a supporting structure of the instrument 100 at a location near to the pump 190 and within an exterior surface of the instrument 100. The antenna 194 senses electromagnetic interference generated by the pump 190 and transmits signals representing the sensed electromagnetic interference to the electronic controller 150. In some instances, the antenna 194 transmits signals representing an amplified, sensed electromagnetic interference to the electronic controller 150. The electromagnetic interference generated by the pump 190 may have a frequency between 1000 Hz and 2000 Hz (for example, 1500 Hz).

While FIG. 1 illustrates the scientific instrument 10 as a STEM instrument, the scientific instrument 10 may be or may include one or more different types of optical and/or charged particle microscopes, such as, but not limited to, a scanning electron microscope (SEM), a STEM, a transmission electron microscope (TEM), a charged particle microscope (CPM), a cryo-compatible microscope, a focused ion beam (FIB) microscope, a dual beam microscopy system, or combinations thereof.

Figure 3:
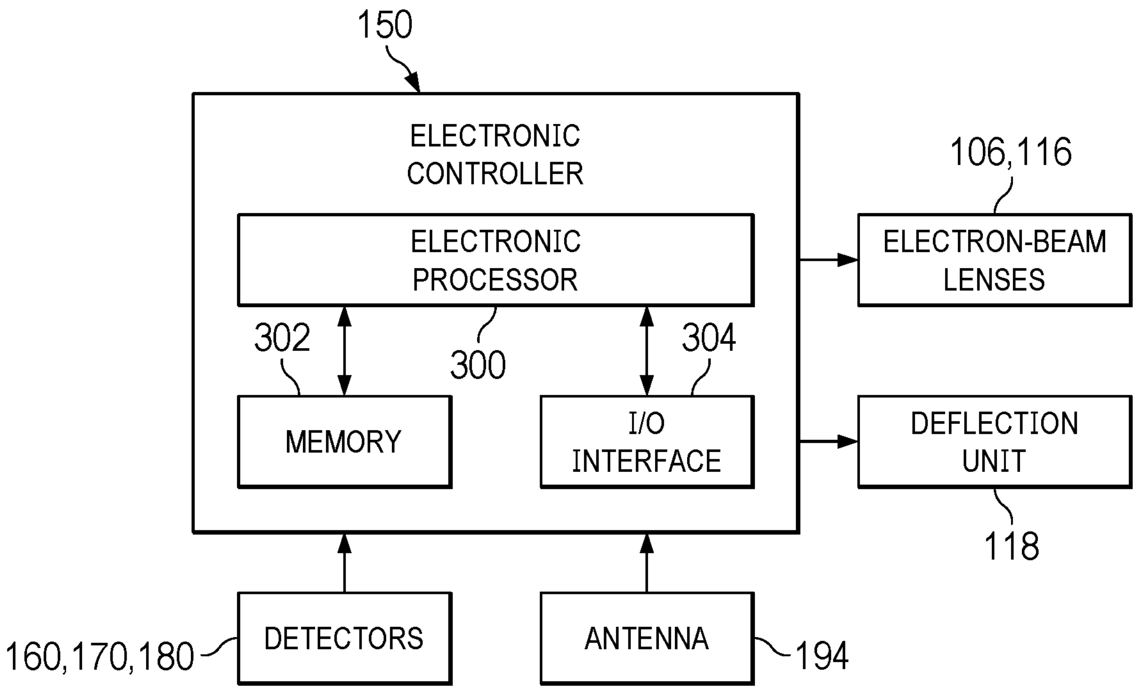
FIG. 3 is a block diagram of a controller of the scientific instrument of FIG. 1 in accordance with some embodiments.

FIG. 3 illustrates a block diagram of the electronic controller 150. The electronic controller 150 includes, among other things, an electronic processor 300, a memory 302, and an input/output (I/O) interface 304. However, it should be understood that the electronic controller 150 may have additional or fewer components. The electronic controller 150 is suitable for the application and setting, and can include, for example, multiple electronic processors, multiple I/O interfaces, multiple data storage devices, or combinations thereof. In some implementations, some or all of the components included in the electronic controller 150 may be attached to one or more mother boards and enclosed in a housing (e.g., including plastic, metal and/or other materials). In some implementations, some of these components may be fabricated onto a single system-on-a-chip, or SoC (e.g., an SoC may include one or more processing devices and one or more storage devices).

As used herein, "processors" or "electronic processors" refers to any device(s) or portion(s) of a device that process electronic data from registers and/or memory to transform that electronic data that may be stored in registers and/or memory. The electronic processor 300 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The memory 302 may include one or more local or remote memory devices such as random-access memory (RAM) devices (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some implementations, the memory 302 may include memory that shares a die with a processor. In such an embodiment, the memory may be used as a cache memory and may include embedded dynamic random-access memory (eDRAM) or spin transfer torque magnetic random-access memory (STT-MRAM), for example. In some implementations, the memory 302 may include non-transitory computer readable media having instructions thereon that, when executed by one or more processors (e.g., the electronic processor 300), causes the electronic controller 150 to store various applications and data for performing one or more of the methods described herein or portions described herein.

The electronic controller 150 is connected to the electron-beam lenses 106 and 116, the deflection unit 118, the detectors 160, 170, and 180, and the antenna 194 via the I/O interface 304. The I/O interface 304 may include one or more communication chips, connectors, and/or other hardware and software to govern communications between the electronic controller 150 and other components. The I/O interface 304 may include interface circuitry for coupling to the one or more components using any suitable interface (e.g., a Universal Serial Bus (USB) interface, a High-Definition Multimedia Interface (HDMI) interface, a Controller Area Network (CAN) interface, a serial Peripheral Interface (SPI) interface, an Ethernet interface, a wireless interface, or any other appropriate interface). For example, the I/O interface 304 may include circuitry for managing wireless communications for the transfer of data to and from the electronic controller 150. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although, in some implementations the associated devices might not. Circuitry included in the I/O interface 304 for managing wireless communications may implement any of a number of wireless standards or protocols, including but not limited to Institute for Electrical Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). In some implementations, circuitry included in the I/O interface 304 for managing wireless communications may operate in accordance with a Global System for Mobile Communication (GSM), General Packet Radio Service (GPRS), Universal Mobile Telecommunications System (UMTS), High Speed Packet Access (HSPA), Evolved HPS (E-HPSA), or LTE network. In some implementations, circuitry included in the I/O interface 252 for managing wireless communications may operate in accordance with Enhanced data for GSM Evolution (EDGE), GSM EDGE Radio Access Network (GERAN), Universal Terrestrial Radio Access Network (UTRAN), or Evolved UTRAN (E-UTRAN). In some implementations, circuitry included in the I/O interface 304 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some implementations, the I/O interface 304 may include one or more antennas (e.g., one or more antenna arrays) for receipt and/or transmission of wire communications.

Figure 4:
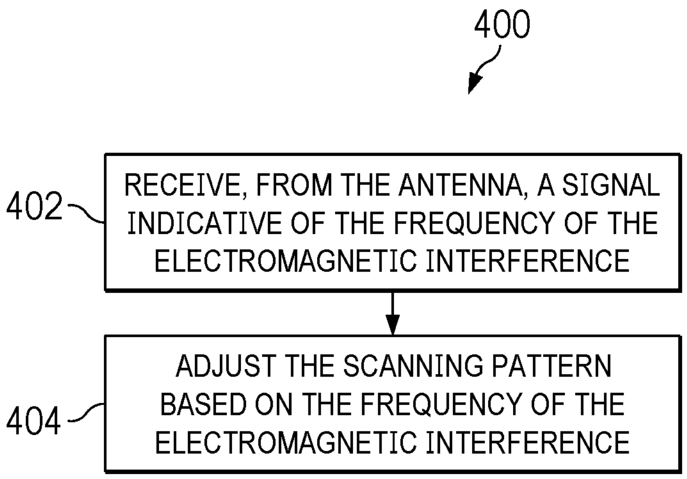
FIG. 4 is a block diagram of a method performed by a controller of FIG. 3 in accordance with some embodiments.

FIG. 4 illustrates a block diagram of an example method 400 for controlling a scanning pattern of the scientific instrument 100. The method 400 is described herein as being performed by the electronic controller 150. However, it should be understood that the method 400 (or portions thereof) may be performed by one or more electronic controllers 150 located within the instrument 100, separate or remote from the instrument 100, or a combination thereof.

At step 402, the electronic controller 150 receives, from the antenna 194, a signal indicative of a frequency of the electromagnetic interference. For example, the antenna 194 detects electromagnetic interference generated by the pump 190. The antenna 194 transmits signals representing the sensed electromagnetic interference to the electronic controller 150.

Figure 5A:
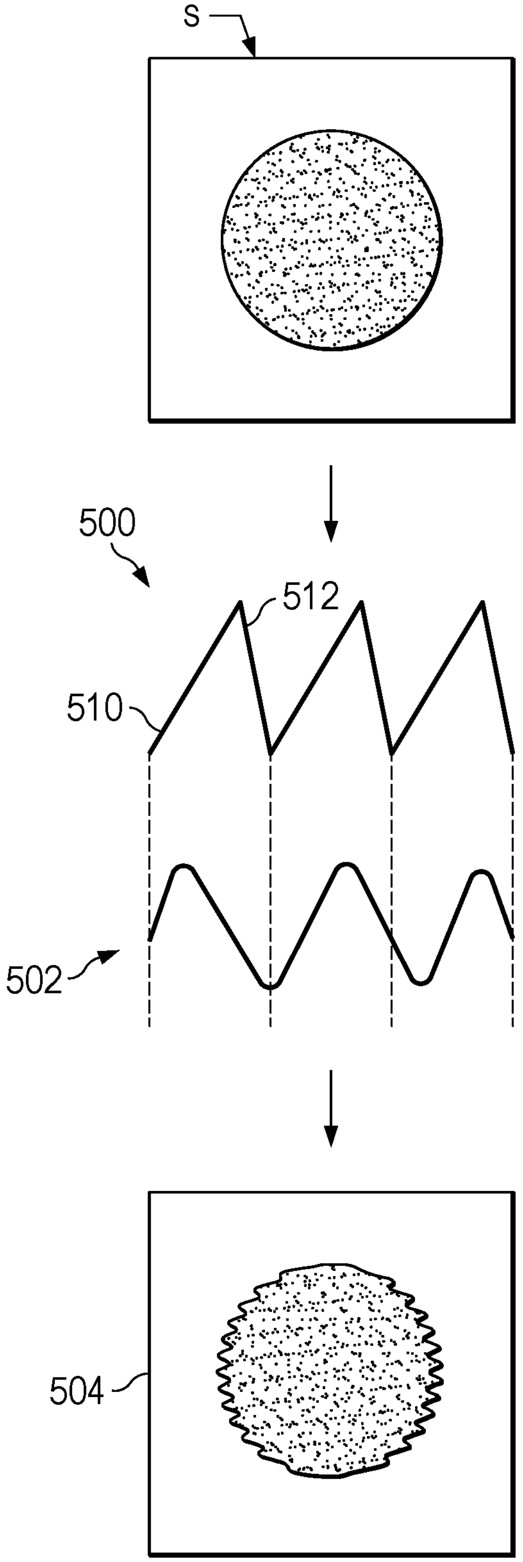
FIG. 5A is an illustration of an image of a sample and a scanning pattern uncorrected to account for electromagnetic interference.

At step 404, the electronic controller 150 adjusts the scanning pattern performed via the instrument 100 based on the frequency of the electromagnetic interference. For example, with reference to FIG. 5A, the sample S is scanned using a plurality of scan lines 500. The scan lines 500 form the scanning pattern and include an acquisition portion 510 and a flyback portion 512. However, electromagnetic interference 502 impacts the plurality of scan lines 500, resulting in a misshaped imaged sample 504.

Figure 5B:
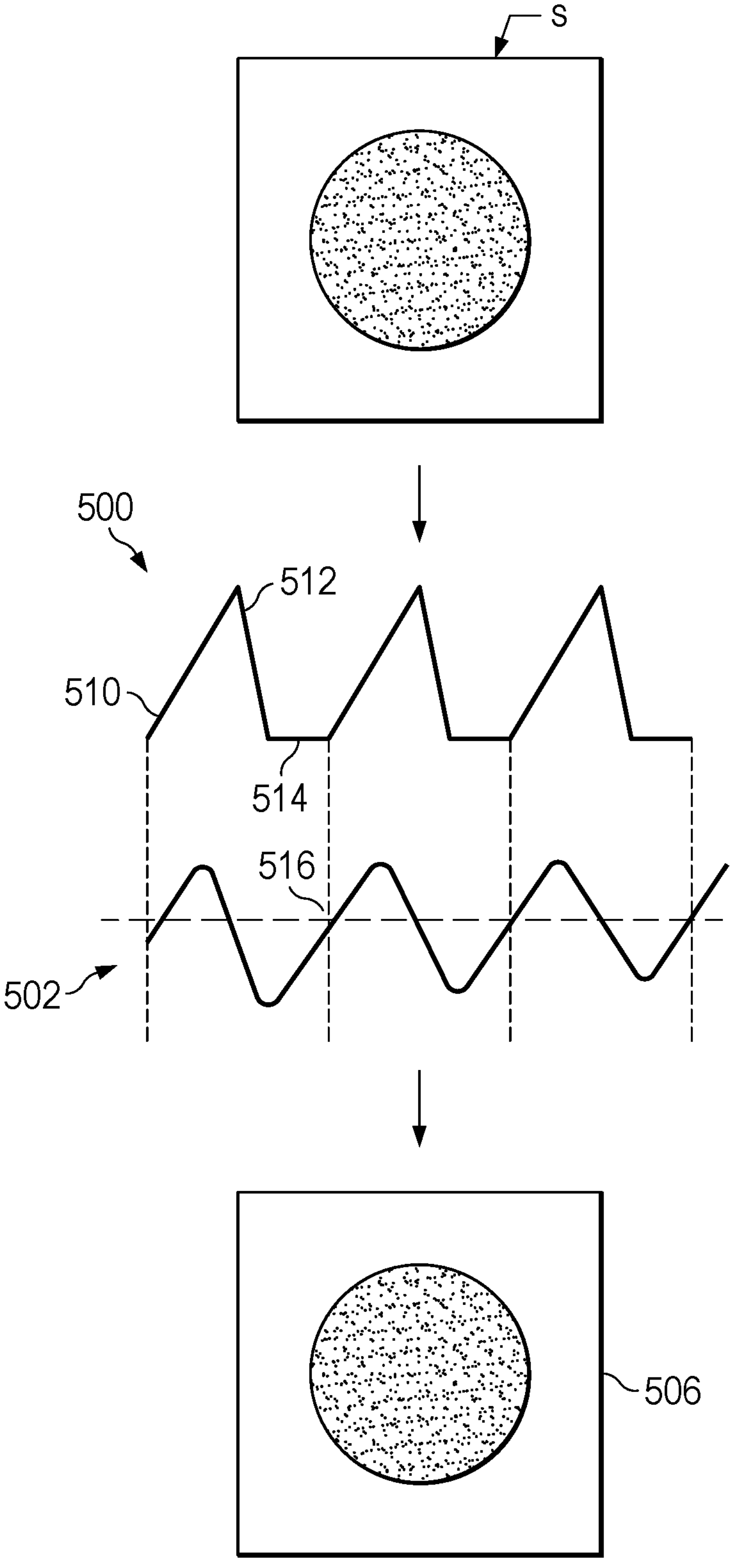
FIG. 5B is an illustration of an image of a sample and a scanning pattern corrected to account for electromagnetic interference.

Accordingly, in one implementation, to adjust the scanning pattern, the electronic controller 150 aligns a start of each scan line in the plurality of scan lines 500 with zero crossings 516 of the electromagnetic interference 502, as shown in FIG. 5B. Aligning the scan lines 500 with the zero crossings 516 may be achieved by inserting a delay period 514 after the flyback portion 512 of the scan lines 500. By aligning the scan lines 500 with the zero crossings 516, the impact of the electromagnetic interference 502 is lessened and the imaged sample 506 is essentially similar to the sample S.

In another implementation, to adjust the scanning pattern, the electronic controller 150 adjusts a dwell time of the electron beam 114. Dwell time is the amount of time the electron beam 114 stays on the sample S per pixel during acquisition of an image of the sample S. For example, multiplying the dwell time by the number of pixels in one scan line and adding in flyback time provides the scan time for a single scan line.

In one example, the electron beam 114 has a per position dwell time of 200 ns and a scan time of approximately 200 to 400 μs per scan line. In an instance where the electromagnetic interference has a frequency of 1500 Hz, the resulting scan line time is approximately 667 μs per line. Accordingly, anywhere from 267 μs to 467 μs is lost and approximately half the sample exposure time is unused. The time to further reposition the electron beam to the start of the next scan line also takes, for example, tens of μs, which further adds to the time lost.

To account for this period of rest, the per position line time may be calculated and adjusted based on the frequency of the electromagnetic interference to maximize the effective exposure time of each scan line. For example, when the electromagnetic frequency has a frequency of 1500 Hz, the line time may be set to within the synchronization period of 667 μs. For example, for 960 positions per line and a flyback overhead of 10 μs, the per-position dwell time is set to (667-10) μs/960=684 ns. For 1920 positions per line, the per position line time is set to (667-10) μs/1920=342 ns. The per position line time may be further rounded to the timing granularity of the electronic controller 150 and the deflection unit 118, such as being rounded down to the closest 25 ns value (e.g., 675 ns and 325 ns).

While examples described herein are primarily directed to electromagnetic interference generated by vacuum pumps in scanning electron microscopes, the impact of electromagnetic interference generated by other components may also be mitigated. For example, a motor that moves the sample holder 110 may generate electromagnetic interference that impacts the accuracy of the scanning result. Accordingly, the antenna 194 (or an antenna in addition to the antenna 194) may be situated on the sample holder 110. As another example, a DC/DC converter or other electronics within the scientific instrument 100 may generate electromagnetic interference. The frequency of the electromagnetic interference generated by such components may vary from the frequency of electromagnetic interference generated by the pump 190. For example, a DC/DC converter may generate electromagnetic interference having a frequency between 100 kHz and 200 kHz.

Additionally, while examples described herein are primarily directed to accounting for electromagnetic interference, in some instances, the impact of mechanical vibrations within the scientific instrument 10 may also or alternatively be mitigated. For example, in place of the antenna 194, a vibration sensor may be provided and that is configured to detect vibrations caused by moving and/or rotating components attached to the STEM column 102. As one implementation of detecting vibrations, the vibration sensor is configured as a movement-sensitive (MEMS) sensor. The electronic controller 150 receives signals from the MEMS sensor and determines the frequency of mechanical vibrations based on the signals from the MEMS sensor.

Accordingly, implementations described herein provide systems, methods, computing and storage devices, and computer-readable media for controlling a scanning pattern of a scientific instrument based on electromagnetic interference. Implementations described herein improve the accuracy of scanning samples. Thus, implementations disclosed herein provide improvements to scanning scientific instruments.

As described above in the detailed description, reference is made to the accompanying drawings that form a part hereof wherein like numerals designate like parts throughout, and in which is shown, by way of illustration, implementations that may be practiced. It is to be understood that other implementations may be utilized, and structured or logical changes may be made, without departing from the scope of the present disclosure. Therefore, the detailed description as described above is not to be taken in a limiting sense.

Various operations may be described as multiple discrete actions or operations in turn, in a manner that is most helpful in understanding the subject matter disclosed herein. However, the order of description should be construed as to imply that these operations are necessarily order dependent. In particular, these operations may not be performed in the order of presentation. Operations described may be performed in a different order from the described implementation. Various additional operations may be performed, and/or described operations may be omitted in additional implementations.

Clauses

Implementations of the present disclosure are disclosed in the following clauses:

Clause 1. A charged particle instrument comprising: a chamber supporting a sample; a column coupled to the chamber, the column comprising a charged particle source configured to generate a charged particle beam traveling through the column and into the chamber, wherein the charged particle beam is generated according to a scanning pattern; a pump configured to establish a vacuum within the chamber; a sensing device configured to detect a measure of a frequency of electromagnetic interference generated via the pump; and a controller including an electronic processor and a memory, the controller configured to: receive, from the sensing device, a signal indicative of the frequency of the electromagnetic interference, and adjust the scanning pattern based on the frequency of the electromagnetic interference.

Clause 2. The charged particle instrument of clause 1, wherein the frequency of the electromagnetic interference is between approximately 1000 Hz and 2000 Hz.

Clause 3. The charged particle instrument of clause 2, wherein the frequency of the electromagnetic interference is approximately 1500 Hz.

Clause 4. The charged particle instrument of any one of clauses 1-3, wherein the pump includes one or more magnets generating the electromagnetic interference.

Clause 5. The charged particle instrument of any one of clauses 1-4, wherein adjusting the scanning pattern includes aligning a start of each scan line forming the scanning pattern with zero crossings of the electromagnetic interference.

Clause 6. The charged particle instrument of any one of clauses 1-5, wherein adjusting the scanning pattern includes inserting a delay period into each scan line forming the scanning pattern based on the frequency of the electromagnetic interference.

Clause 7. The charged particle instrument of any one of clauses 1-6, wherein the sensing device is configured to amplify the frequency of the electromagnetic interference to generate the signal.

Clause 8. The charged particle instrument of any one of clauses 1-7, wherein the sensing device is mounted on a printed circuit board mounted to a surface of the pump.

Clause 9. The charged particle instrument of any one of clauses 1-8, wherein adjusting the scanning pattern includes adjusting a line time of the scanning pattern.

Clause 10. A charged particle instrument comprising: a chamber supporting a sample; a column coupled to the chamber, the column comprising a charged particle source configured to generate a charged particle beam traveling through the column and into the chamber, wherein the charged particle beam is generated according to a scanning pattern; an antenna configured to detect a frequency of electromagnetic interference generated by the charged particle instrument; and a controller including an electronic processor and a memory, the controller configured to: receive, from the antenna, a signal indicative of the frequency of the electromagnetic interference, and align a start of each scan line forming the scanning pattern with zero crossings of the electromagnetic interference.

Clause 11. The charged particle instrument of clause 10, wherein the frequency of the electromagnetic interference is greater than 1000 Hz.

Clause 12. The charged particle instrument of any one of clauses 10-11, wherein aligning the start of each scan line with zero crossing of the electromagnetic interference includes inserting a delay period into each scan line forming the scanning pattern based on the frequency of the electromagnetic interference.

Clause 13. The charged particle instrument of any one of clauses 10-12, wherein the antenna is configured to amplify the frequency of the electromagnetic interference to generate the signal.

Clause 14. The charged particle instrument of any one of clauses 10-13, wherein the controller is further configured to adjust a dwell time of the scanning pattern based on the frequency of the electromagnetic interference.

Clause 15. A method for adjusting a scanning pattern in a charged particle instrument, the method comprising: receiving, from an antenna and with an electronic processor, a signal indicative of a frequency of electromagnetic interference, wherein the electromagnetic interference is generated by a pump configured to establish a vacuum within a chamber supporting a sample, and adjusting, with the electronic processor, a scanning pattern of a charged particle beam based on the frequency of the electromagnetic interference, wherein the charged particle beam is generated by a charged particle source of a column, wherein the column is coupled to the chamber, and wherein the charged particle beam travels through the column to the chamber.

Clause 16. The method of clause 15, wherein the frequency of the electromagnetic interference is between approximately 1000 Hz and 2000 Hz.

Clause 17. The method of any one of clauses 15-16, wherein adjusting the scanning pattern includes aligning, with the electronic processor, a start of each scan line forming the scanning pattern with zero crossings of the electromagnetic interference.

Clause 18. The method of any one of clauses 15-17, wherein adjusting the scanning pattern includes inserting, with the electronic processor, a delay period into each scan line forming the scanning pattern based on the frequency of the electromagnetic interference.

Clause 19. The method of any one of clauses 15-18, further comprising generating the signal by amplifying, with the antenna, the frequency of the electromagnetic interference.

Clause 20. The method of any one of clauses 15-19, wherein adjusting the scanning pattern includes adjusting, with the electronic processor, a dwell time of the scanning pattern.

What is claimed is:

1. A charged particle instrument comprising:

a chamber supporting a sample;

a column coupled to the chamber, the column comprising a charged particle source configured to generate a charged particle beam traveling through the column and into the chamber, wherein the charged particle beam is generated according to a scanning pattern;

a pump configured to establish a vacuum within the chamber;

a sensing device configured to detect a measure of a frequency of electromagnetic interference generated via the pump; and a controller including an electronic processor and a memory, the controller configured to:

receive, from the sensing device, a signal indicative of the frequency of the electromagnetic interference, and adjust the scanning pattern based on the frequency of the electromagnetic interference.

2. The charged particle instrument of claim 1, wherein the frequency of the electromagnetic interference is between approximately 1000 Hz and 2000 Hz.

3. The charged particle instrument of claim 2, wherein the frequency of the electromagnetic interference is approximately 1500 Hz.

4. The charged particle instrument of claim 1, wherein the pump includes one or more magnets generating the electromagnetic interference.

5. The charged particle instrument of claim 1, wherein adjusting the scanning pattern includes aligning a start of each scan line forming the scanning pattern with zero crossings of the electromagnetic interference.

6. The charged particle instrument of claim 1, wherein adjusting the scanning pattern includes inserting a delay period into each scan line forming the scanning pattern based on the frequency of the electromagnetic interference.

7. The charged particle instrument of claim 1, wherein the sensing device is configured to amplify the frequency of the electromagnetic interference to generate the signal.

8. The charged particle instrument of claim 1, wherein the sensing device is mounted on a printed circuit board mounted to a surface of the pump.

9. The charged particle instrument of claim 1, wherein adjusting the scanning pattern includes adjusting a line time of the scanning pattern.

10. A charged particle instrument comprising:

a chamber supporting a sample;

a column coupled to the chamber, the column comprising a charged particle source configured to generate a charged particle beam traveling through the column and into the chamber, wherein the charged particle beam is generated according to a scanning pattern;

an antenna configured to detect a frequency of electromagnetic interference generated by the charged particle instrument; and a controller including an electronic processor and a memory, the controller configured to:

receive, from the antenna, a signal indicative of the frequency of the electromagnetic interference, and align a start of each scan line forming the scanning pattern with zero crossings of the electromagnetic interference, wherein aligning the start of each scan line with zero crossing of the electromagnetic interference includes inserting a delay period into each scan line forming the scanning pattern based on the frequency of the electromagnetic interference.

11. The charged particle instrument of claim 10, wherein the frequency of the electromagnetic interference is greater than 1000 Hz.

12. The charged particle instrument of claim 10, wherein the controller is further configured to adjust a dwell time of the scanning pattern based on the frequency of the electromagnetic interference.

13. A method for adjusting a scanning pattern in a charged particle instrument, the method comprising:

receiving, from an antenna and with an electronic processor, a signal indicative of a frequency of electromagnetic interference, wherein the electromagnetic interference is generated by a pump configured to establish a vacuum within a chamber supporting a sample, and adjusting, with the electronic processor, a scanning pattern of a charged particle beam based on the frequency of the electromagnetic interference, wherein the charged particle beam is generated by a charged particle source of a column, wherein the column is coupled to the chamber, and wherein the charged particle beam travels through the column to the chamber.

14. The method of claim 13, wherein the frequency of the electromagnetic interference is between approximately 1000 Hz and 2000 Hz.

15. The method of claim 13, wherein adjusting the scanning pattern includes aligning, with the electronic processor, a start of each scan line forming the scanning pattern with zero crossings of the electromagnetic interference.

16. The method of claim 13, wherein adjusting the scanning pattern includes inserting, with the electronic processor, a delay period into each scan line forming the scanning pattern based on the frequency of the electromagnetic interference.

17. The method of claim 13, further comprising generating the signal by amplifying, with the antenna, the frequency of the electromagnetic interference.

18. The method of claim 13, wherein adjusting the scanning pattern includes adjusting, with the electronic processor, a dwell time of the scanning pattern.

* * * * *